United States Patent [19]
Kim et al.

[11] Patent Number: 4,767,724
[45] Date of Patent: Aug. 30, 1988

[54] UNFRAMED VIA INTERCONNECTION WITH DIELECTRIC ETCH STOP

[75] Inventors: Manjin J. Kim; Bruce F. Griffing, both of Schenectady; David W. Skelly, Burnt Hills, all of N.Y.

[73] Assignee: General Electric Company, Schenectady, N.Y.

[21] Appl. No.: 845,110

[22] Filed: Mar. 27, 1986

[51] Int. Cl.$^4$ .......................................... H01L 21/441
[52] U.S. Cl. .................................. 437/194; 437/195; 156/656; 156/667
[58] Field of Search ............... 156/646, 653, 662, 667; 437/195, 194

[56] References Cited

U.S. PATENT DOCUMENTS

| | | | |
|---|---|---|---|
| 3,978,577 | 9/1976 | Bhattacharyya et al. | 29/571 |
| 4,067,099 | 1/1978 | Ito et al. | 29/571 |
| 4,157,269 | 6/1979 | Ning et al. | 148/1.5 |
| 4,289,574 | 9/1981 | Radigan et al. | 156/643 |
| 4,412,119 | 10/1983 | Komatsu et al. | 156/643 X |
| 4,426,249 | 1/1984 | Brown et al. | 156/653 |
| 4,433,004 | 2/1984 | Yonezawa et al. | 437/195 X |
| 4,444,618 | 4/1984 | Saia et al. | 156/643 |
| 4,511,430 | 4/1985 | Chen et al. | 156/643 |
| 4,634,495 | 1/1987 | Gobrecht et al. | 156/643 |

FOREIGN PATENT DOCUMENTS

0175604  3/1986  European Pat. Off. .

OTHER PUBLICATIONS

IBM Technical Disclosure Bulletin, vol. 9, No. 5, Oct. 1966, pp. 544–545, New York, U.S.: P. P. Castrucci et al.: "Etching Technique for Semi-Conductor Device Application.

IBM Technical Disclosure Bulletin, vol. 24, No. 10, Mar. 1982, pp. 5133–5134, New York, U.S.: S. Boyar et al.: "Quartz Trench RIE Etch Stop".

Journal of the Electrochemical Soc., vol. 132, No. 8, Aug. 1985, pp. 1954–1957; Manchester, N.H., U.S.: R. J. Saia et al.: "Dry Etching of Tapered Contact Holes Using Multi-Layer Resist".

International Electron Devices Meeting, Technical Digest, Dec. 6–8, 1976, Washington, pp. 205–207; IEEE, N.Y., U.S.: R. C. Poulsen et al.; "Plasma Etching of Aluminum".

Oakley, R. E. et al., "Pillars—The Way to Two Micron Pitch Multilever Metallization", V-MIC Conf., Jun. 21–22, 1984, pp. 23–29.

Fried, L. J. et al., "A VSLI Bipolar Metallization Design with Three-Level Wiring and Area Array Solder Connections", *IMB J. Res. Develop.*, vol. 26, No. 3, May 1982, pp. 362–370.

*Primary Examiner*—Olik Chaudhuri
*Attorney, Agent, or Firm*—Lawrence D. Cutter; James C. Davis, Jr.; Marvin Snyder

[57] ABSTRACT

A layer of aluminum oxide or other insulative metal oxide is employed as an etch stop in the fabrication of very large scale integrated circuit devices. The use of such etch stops permits fabrication of unframed or borderless via openings and correspondingly permits greater metallization line pitch, smaller circuit features, and more reliable interlayer electrical contact. A method for insulative metal oxide deposition is also described.

5 Claims, 4 Drawing Sheets

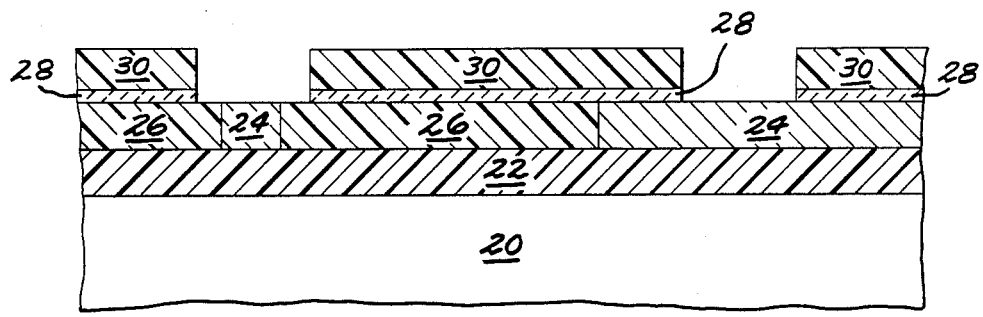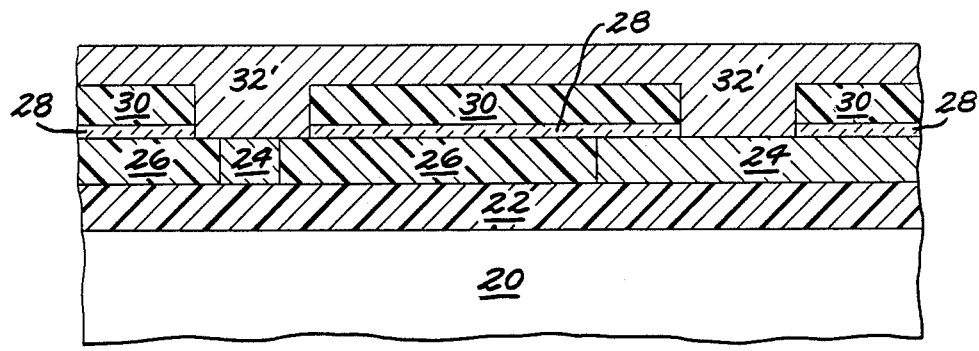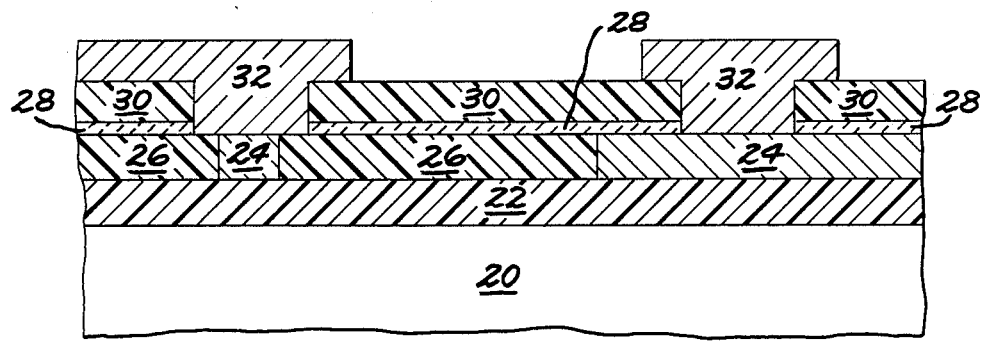

UNFRAMED VIA INTERCONNECTION WITH DIELECTRIC ETCH STOP

BACKGROUND OF THE INVENTION

The present invention is generally directed to the formation of via openings in large scale integrated circuit devices. More particularly, the present invention is directed to the use of aluminum oxide as an etch stop material.

In the fabrication of very large scale integrated circuit devices (VLSI), it is desirable to shrink feature sizes as much as possible, and preferably to sizes smaller than one micron. This shrinking in device size enables circuit chip designers to incorporate many more electrical circuit and logic functions on a single device. Shrinkage of device dimensions also increases the speed at which the devices can operate since propagation delay between distinct devices is reduced along with reduction in the distance between adjacent devices.

However, the shrinkage of device sizes is fraught with many practical problems. In particular, because of registration problems encountered with the use of different photo masks used in device patterning, it is typically necessary to employ "frames" around via openings which extend between different layers in VLSI devices. These frames are typically present as wider areas in the metal interconnection patterns. They are provided to ensure contact between upper and lower levels of metallization through via openings in a dielectric layer in spite of mask alignment or registration variations. However, via frames not only consume device area, but also increase the distance between metallization line patterns (line pitch). The via frames are required to be sufficiently large to ensure interlevel electrical connection even in the case of mask misalignment or misregistration. The size of the via frames then is seen to be a limiting factor in shrinking overall device size.

Prior attempts at developing unframed via connections to increase interconnection layout density have generally formed a via opening by etching down to an unframed metal line buried in a material such as silicon oxide. Since the depth of the required via depends on which layer is being contacted and since the depth of any given layer at various locations is usually different after planarization of overlying dielectric layers, many via depths must be etched in the same step. Furthermore, in unframed structures, vias are not always precisely aligned with underlying conductors resulting in an etch which often etches beyond the edge of these underlying conductors. This often further contributes to poor interlevel connections. Moreover, the selectivity of nitride or oxy-nitride used as an etch stop is not sufficiently high to effectively block the over-etching.

SUMMARY OF THE INVENTION

In accordance with a preferred embodiment of the present invention, a method for forming via openings, especially during integrated electric circuit chip fabrication, comprises several steps, the first of these is etching a dielectric layer to provide via openings therein. The first etching must be selective and is performed down to a layer of aluminum oxide lying beneath a dielectric layer so as not to extend the etching beyond the aluminum oxide. The second etching removes the aluminum oxide and is performed down to a layer of conductive material so that the underlying conductive layer is exposed through openings etched in the dielectric layer and the aluminum oxide layer. The second etch is not necessarily selective with respect to underlying conductive material as long as the layer of aluminum oxide is thin. It is noted that, while aluminum oxide is a preferred etch stop material for the practice of the present invention, other insulative metal oxides such as magnesium oxide may also be employed. Mixtures of aluminum oxide and magnesium oxide, spinel, may also be employed. For use as an etch stop, it is desirable that the insulative metal oxide employed have similar mechanical properties to the substrate it is disposed on, particularly its thermal expansion properties.

In accordance with another embodiment of the present invention, a method for forming via openings in the fabrication of electrical integrated circuit devices comprises a sequence of steps starting with the deposition and patterning of a conductive layer overlying an insulative substrate. A first dielectric layer is then deposited covering the patterned conductive layer. The first dielectric layer is then planarized at least down to the level of the conductive layer, and a layer of aluminum oxide is deposited over the resulting planarized substrate. A second dielectric layer is deposited and patterned over the aluminum oxide layer so as to provide openings in the second dielectric layer disposed at least partially over underlying portions of the patterned conductive layer. These openings in the second dielectric layer extend to the aluminum oxide layer. The aluminum oxide layer is then removed where it occurs at the bottom of the via openings in the second dielectric layer. A second conductive layer is then preferably deposited and patterned so that contact is selectively made through openings in the second dielectric layer and through the corresponding openings in the aluminum oxide layer, to material in the first or underlying conductive layer.

Accordingly, it is an object of the present invention to provide etch stop functioning for materials used in via opening fabrication.

It is also an object of the present invention to provide an unframed contact window or via without overetching underlying oxide in misaligned or oversized vias.

It is yet another object of the present invention to reduce chip area devoted to metal interconnections in VLSI circuit devices.

Is is still another object of the present invention to provide more densely constructed electrical circuit devices.

Lastly, but not limited hereto, it is an object of the present invention to provide a method for electrical interconnection between patterned metal layers in VLSI devices, particularly in such a way as to overcome problems of mask alignment and registration and especially such problems brought on by reduced device size.

BRIEF DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 1–11 are a sequence of cross-sectional, side elevation views schematically illustrating the formation of two via openings in accordance with the method of the present invention.

DETAILED DESCRIPTION OF THE INVENTION

Figure 1:
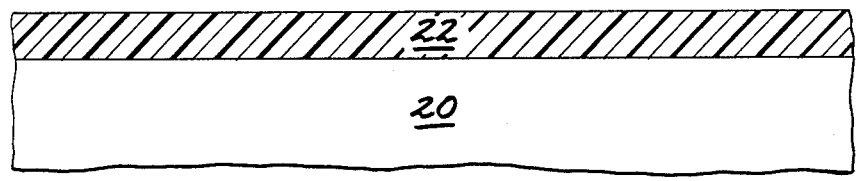
Figure 2:
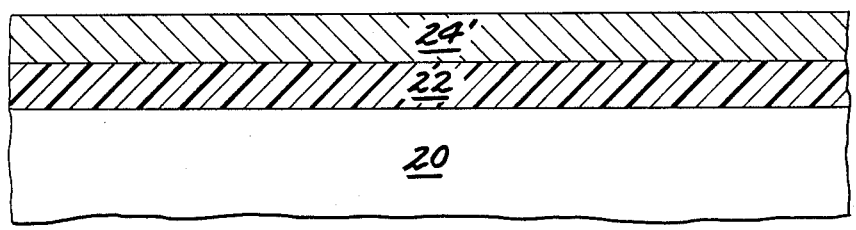
Figure 3:
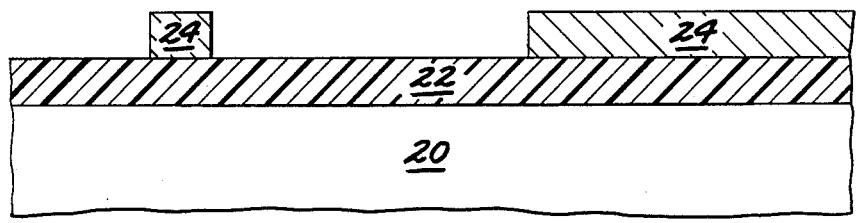
Figure 4:
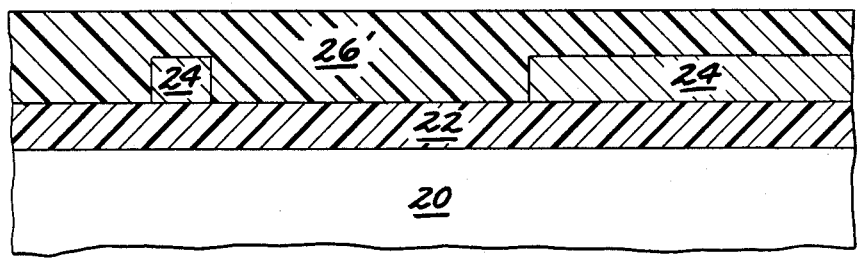

FIG. 1 illustrates a typical starting point for relevant aspects of integrated circuit device manufacture. In particular, underlying substrate 20 is provided with insulative layer 22. Typically, (although not restricted thereto) substrate 20 comprises silicon and dielectric layer 22 comprises silicon oxide which is either grown or deposited on substrate 20. Dielectric layer 22 may be typically referred to as "field oxide" and serves to provide electrical isolation between various devices on the chip. Next, as illustrated in FIG. 2, metallization layer 24' is provided by deposition. Although not illustrated in the sequence of figures provided herein, metallization layer 24' might also typically include such device features as source and drain contact material. Layer 24' is then patterned in accordance with desired electrical functionality. A typical cross-sectional view of the resulting structure is illustrated in FIG. 3. It is noted in FIGS. 2–11, that primed reference numerals denote layers prior to patterning; while the same unprimed reference numerals denote the same layer subsequent to patterning. It is further noted herein that the patterning of the various layers indicated may be performed by conventional methods in which a photoresist is applied and is exposed to electromagnetic radiation through a patterned mask and is then selectively removed in accordance with the designs that exist on the mask. Both positive and negative masking and photoresist process steps may be employed.

Figure 5:
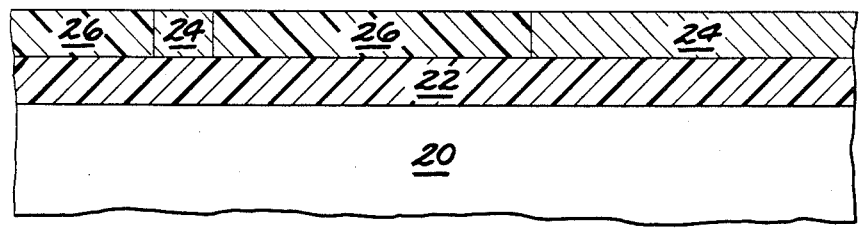

Next, the structure shown in FIG. 3 is provided with a second dielectric layer 26' (see FIG. 4) which is subsequently planarized at least down to the layer of metallization 24. Aluminum oxide, magnesium oxide, or combinations thereof which tend to form spinel, are deposited by RF sputtering in an evacuable chamber. The chamber is preferably maintained at a pressure of approximately 12 microns while a mixture of oxygen and an inert gas flow through the chamber. Argon is a preferred inert gas. In this case, the gas mixture preferably comprises 10% oxygen by volume. Metal for formation of insulative metal oxides is provided from a metal sample or samples disposed within the chamber and exposed to RF electromagnetic energy supplied at a rate of approximately 500 watts. The voltage applied to the metal sample is typically about 300 volts. It is noted that, while layer 24 is hatched and described above as comprising metal, it is also possible for this layer to comprise conductive material such as doped polysilicon. This would be particularly true if the conductive pattern represented gate electrode material. The resulting structure is illustrated in FIG. 5. While the metal oxide may also be deposited from a metal oxide sputtering source, a metal source is preferred.

Figure 6:
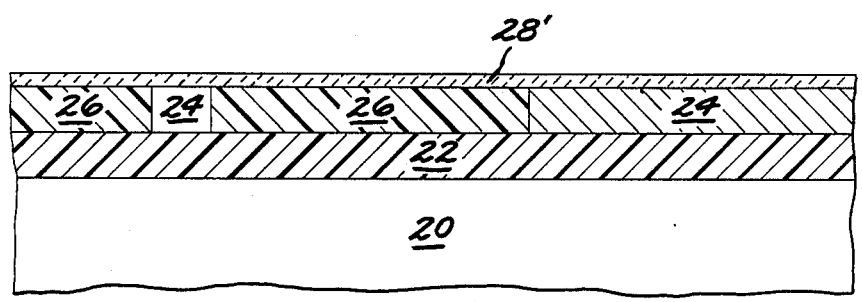
Figure 7:
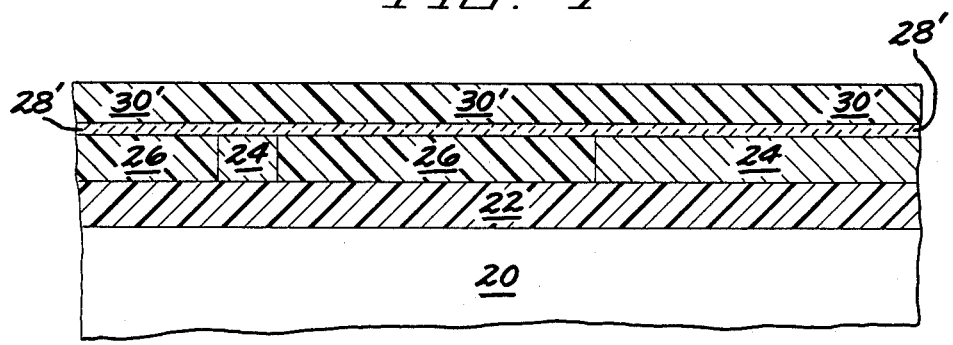

Next, and most importantly with respect to the present invention, a thin layer of aluminum oxide 28' is provided, substantially as shown in FIG. 6. As discussed below, the aluminum oxide acts as an etch stop in via formation to provide electrical contact to underlying metallization patterns 24. Next, as seen in FIG. 7, third dielectric layer 30' is deposited on the substrate so as to overlie the thin layer 28' of aluminum oxide which is preferably about 500 angstroms thick. The thin and uniform layer of aluminum oxide is deposited by sputtering of pure aluminum oxide in the presence of oxygen as part of the residual gas. The sputtering is performed in an evacuable chamber at a total pressure of 12 microns. A mixture of argon (or other inert gas) and oxygen is passed through the chamber at a flow rate of approximately 25 cc/minute. The mixture preferably comprises approximately 10% oxygen and 90% argon, by volume. Argon is the preferred inert gas.

Figure 8:
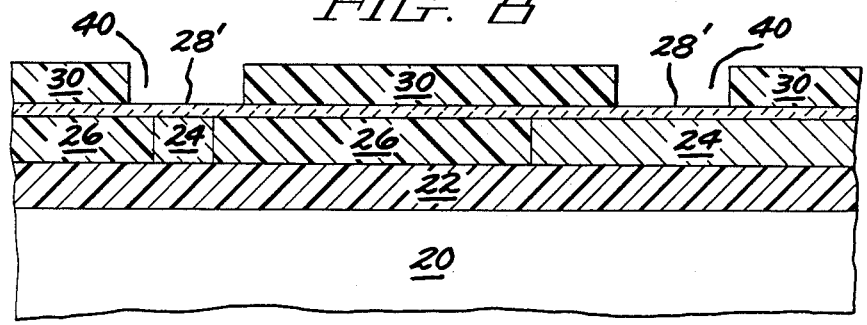

Third dielectric layer 30' is then patterned so as to provide via openings 40. These are illustrated in FIG. 8. It is the process step transition illustrated as occurring between FIGS. 7 and 8 which most clearly illustrates the functioning of the aluminum oxide layer in the present invention. Etch stop layer 28' prevents etching of material disposed beneath it. Etching of layer 30' to form patterned layer 30 is performed so as to be highly selective toward dielectric layer 30 which preferably comprises material such as silicon oxide. In particular, etching of layer 30' is preferably performed by reactive ion etching. Moreover, this etching is preferably performed in an atmosphere of $NF_3$ and argon. It is preferred that the etching of dielectric layer 30 be approximately 50 to 1 in its selectivity as compared to aluminum oxide. Reactive ion etching in the atmosphere described achieves this degree of selectivity. It is noted, however, that an atmosphere comprising $CHF_3$ and argon may be employed although this is not the preferred etching gas.

It is also seen that it is desirable to employ reactive ion etching to mitigate the problems of undercutting in providing vias through particularly deep layers of dielectric. Accordingly, it is seen that aluminum oxide layer 28' acts as an effective etch stop and prevents etching of underlying layer 26 and even attack on patterned conductive layer 24. The method of the present invention is also seen to be particularly advantageous in those situations in which via openings of multiple depths are present on the substrate being processed. This is illustrated more thoroughly below in reference to FIG. 12. Etching is performed for a time sufficient to achieve highly selective removal of dielectric layer 30. An aluminum oxide layer approximately 500 angstroms thick can effectively mask etching of multiple via depth circuit devices within a maximum depth of about 1 micrometer.

However, to achieve connection with underlying conductive layer 24, it is necessary to remove portions of etch stop layer 28' at the bottom of the via openings. In particular, this may be accomplished by etching exposed aluminum oxide using $BCl_3$ and $O_2$ gases. The resulting structure with the aluminum oxide layer partially removed is illustrated in FIG. 9. If magnesium oxide or spinel is employed as an etch stop, the same etchants may be employed as for aluminum oxide. It is also noted that magnesium oxide may also be sputter deposited in the same way as aluminum oxide.

Next, second metallization layer 32' is deposited, as seen in FIG. 10, and may be patterned as shown in FIG. 11. In particular, it is seen that good electrical contact made between metallization layer 24 and metallization layer 32 through via openings which are now filled with material from the second metallization layer. The second metallization layer may comprise bias sputtered aluminum or other conductors such as those which are generally sputtered and patterned to make second level (or higher) metal entry connections in VLSI devices. The resulting vias are therefore seen to be borderless or unframed.

Figure 12:
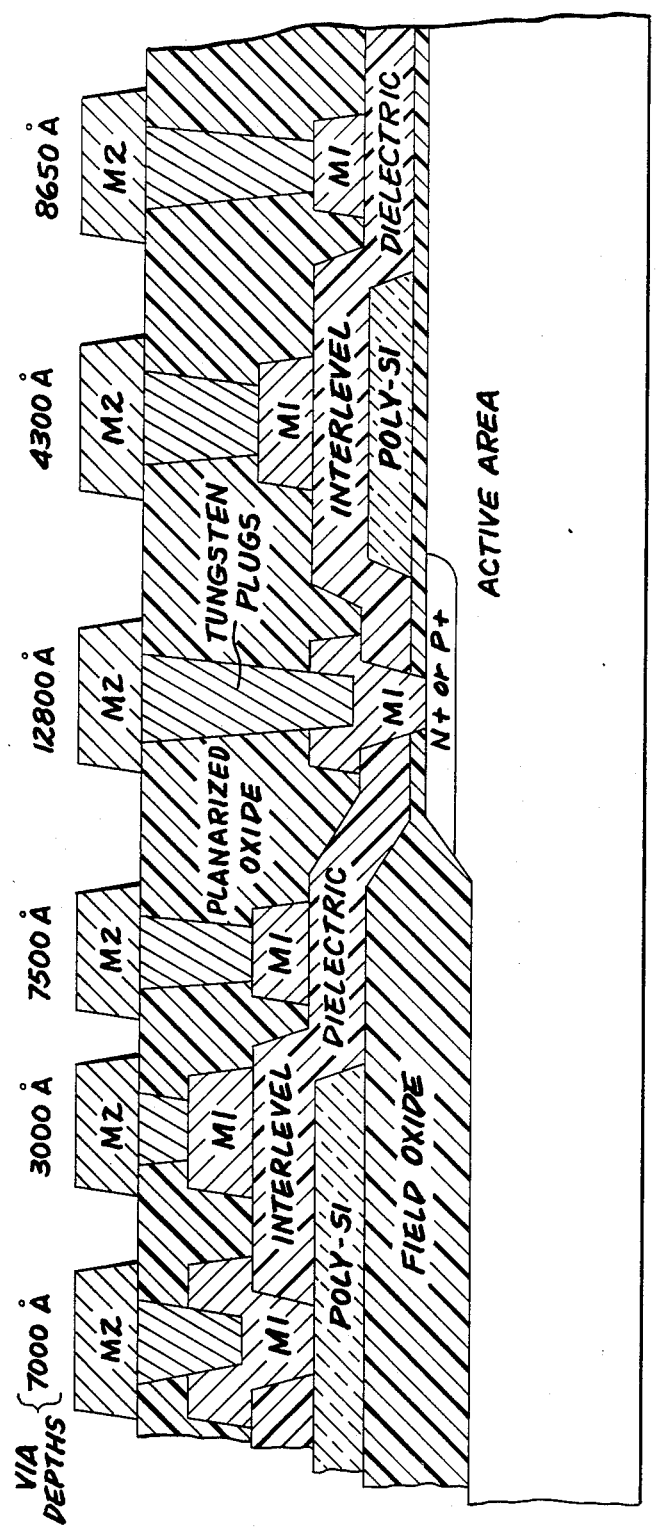
FIG. 12 is a cross-sectional, side elevation view illustrating the multilevel via depth problem in the vicinity of an FET device.

FIG. 12 represents a more realistic cross-sectional, side elevation view of the various conductive insulative layers present in the vicinity of a portion of an integrated circuit device. More particularly, with respect to concerns found in the present application, it is seen that via openings for interlevel connections particularly those filled with tungsten plugs, exhibit varying depths, differing by as much as approximately 1 micron. For example, it is seen that vias as deep as 12,800 angstroms may be required for contact to doped regions in the underlying active area. However, via openings only 3,000 angstroms in depth may be required for interlevel connection between uppermost layers. It is noted that 10,000 angstroms is the same as 1 micron. It is therefore seen that an aluminum oxide layer of approximately 500 angstroms in thickness would suggest that a 20 to 1 selectivity ratio is desirable. An aluminum oxide layer is not, however, shown in FIG. 12 since this figure is merely provided for the purpose of illustrating the problem of multiple via depths.

The reactive ion etch process described above does not necessarily have to be selective to silicon dioxide and molybdenum because aluminum oxide thinner than about 500 angstroms can effectively mask the etching and is effective to expose clean metal surfaces in the via opening. It is also noted that the process step structures illustrated in FIGS. 1-5 comport with conventional practices. It is also noted that the method described completely eliminates both upper and lower level frames so as to form dense multilevel interconnections. While described herein for convenience for the situation in which two conductive layers are patterned and selectively connected, it is noted that the method of the present invention is also extendable to those situations employing many more layers.

From the above, it is seen that the method of the present invention provides means for electrical interconnection between via openings in such a way as to avoid the presence of frames or borders which can consume major portions of VLSI dense area. It is also seen that the method of the present invention is also applicable to connection of lower level metallization patterns to source and drain contacts of field effect transistor devices. It is further seen that the method of the present invention permits a decrease in the metallization pattern line pitch.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for forming via openings in the fabrication of integrated electric circuit devices, said method comprising the steps of:
   depositing and patterning a first conductive metal layer overlying an insulative substrate;
   depositing a first dielectric layer covering said patterned conductive layer;
   planarizing said first dielectric layer, at least down to the level of said conductive layer;
   depositing a layer of insulative metal oxide over said first dielectric layer and portions of said conductive layer exposed by said planarizing;
   depositing and patterning a second dielectric layer on said insulative metal oxide layer, with openings in said second dielectric layer at least partially overlying portions of said patterned conductive layer and extending down to said insulative metal oxide layer; and
   removing insulative metal oxide material exposed through said openings in said second dielectric layer.

2. The method of claim 1 further including the step of:
   depositing and patterning a second conductive layer so that electrical contact is made, through said openings in said second dielectric layer and in said insulative metal oxide layer, to said first conductive layer.

3. The method of claim 1 in which said insulative metal oxide is selected from the group consisting of aluminum oxide, magnesium oxide, and spinel.

4. The method of claim 1 in which said dielectric layer comprises silicon oxide.

5. The method of claim of claim 1 in which said first conductive layer comprises aluminum.

* * * * *